United States Patent
Masuda et al.

(10) Patent No.: US 8,610,132 B2
(45) Date of Patent: Dec. 17, 2013

(54) SEMICONDUCTOR DEVICE AND METHOD FOR MANUFACTURING SEMICONDUCTOR DEVICE

(75) Inventors: Takeyoshi Masuda, Osaka (JP); Keiji Wada, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/613,801

(22) Filed: Sep. 13, 2012

(65) Prior Publication Data

US 2013/0075758 A1     Mar. 28, 2013

Related U.S. Application Data

(60) Provisional application No. 61/539,232, filed on Sep. 26, 2011.

(30) Foreign Application Priority Data

Sep. 26, 2011 (JP) ................................. 2011-208438

(51) Int. Cl.
*H01L 29/78* (2006.01)
(52) U.S. Cl.
USPC .......................................................... 257/77

(58) Field of Classification Search
USPC ..................... 257/77, E29.256, E29.104, 341
See application file for complete search history.

(56) References Cited

U.S. PATENT DOCUMENTS

2004/0036121 A1    2/2004   Aoki et al.

FOREIGN PATENT DOCUMENTS

| JP | 2001-168329 A | 6/2001 |
|---|---|---|
| JP | 2003-086801 A | 3/2003 |
| JP | 2004-079955 A | 3/2004 |
| JP | 2004-146429 A | 5/2004 |
| JP | 2005-322949 A | 11/2005 |
| JP | 2005-340685 A | 12/2005 |

*Primary Examiner* — Tran Tran
(74) *Attorney, Agent, or Firm* — Venable LLP; Michael A. Sartori

(57) ABSTRACT

A MOSFET includes a semiconductor substrate having a trench formed in a main surface, a gate oxide film, a gate electrode, and a source interconnection. A semiconductor substrate includes an n-type drift layer and a p-type body layer. The trench is formed to penetrate the body layer and to reach the drift layer. The trench includes an outer peripheral trench arranged to surround an active region when viewed two-dimensionally. On the main surface opposite to the active region when viewed from the outer peripheral trench, a potential fixing region where the body layer is exposed is formed. The source interconnection is arranged to lie over the active region when viewed two-dimensionally. The potential fixing region is electrically connected to the source interconnection.

6 Claims, 14 Drawing Sheets

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a semiconductor device manufacturing method, and more particularly to a semiconductor device capable of fixing a potential at a surface portion of a semiconductor layer located outside an active region and a semiconductor device manufacturing method capable of manufacturing the semiconductor device.

2. Description of the Background Art

Higher efficiency and lower loss of a power device used for conversion or control of electric energy have recently be demanded. For a MOSFET (Metal Oxide Semiconductor Field Effect Transistor) serving as a power switching device, lowering in ON resistance or the like by improving an element structure or selection of a material has been studied, and for example, a trench (groove) type element structure instead of a planar (plane) type element structure has increasingly been adopted. The trench type element structure refers to an element structure characterized by formation of a channel region along a wall surface of the trench formed in a surface of an element.

Since a MOSFET serving as a power switching device is used for conversion, control, or the like of a high voltage, it is required to achieve high efficiency and low loss as well as a high breakdown voltage. With a trench type element structure, lower loss of an element owing to lowering in ON resistance is achieved, while a breakdown voltage of an element may lower due to a defective shape of a formed trench or the like. Specifically, local electric field concentration occurs in a portion where a defective shape of a trench is present, and resulting high electric field is likely to break a gate insulating film formed on a wall surface of the trench. In order to suppress such lowering in breakdown voltage of an element due to a trench structure, for example, a MOSFET adopting such a structure that a region to serve as an active region of an element is surrounded by a trench different from the trench in the active region has been proposed (see, for example, Japanese Patent Laying-Open No. 2005-322949).

In the MOSFET proposed in PTL 1, by causing a trench surrounding an active region to function as an electric field relaxing portion, a breakdown voltage of an element can be improved. With this MOSFET, however, for example, when a high voltage of approximately 1 kV (kilovolt) is applied, it is difficult to exhibit a sufficient electric field relaxing function. Therefore, in order to obtain resistance of an element against application of such a high voltage, further improvement in element structure is demanded.

SUMMARY OF THE INVENTION

The present invention was made in view of the problems above, and an object thereof is to provide a semiconductor device capable of achieving improved breakdown voltage characteristics by fixing a potential of a semiconductor layer located outside an active region and a semiconductor device manufacturing method capable of manufacturing the semiconductor device.

A semiconductor device according to the present invention includes a semiconductor substrate having a trench formed in one main surface, a first insulating film arranged on and in contact with a wall surface of the trench, a gate electrode arranged on and in contact with the first insulating film, and a first interconnection arranged on one main surface. The semiconductor substrate includes a drift layer having a first conductivity type and a body layer having a second conductivity type, which is arranged on a side of one main surface when viewed from the drift layer. The trench is formed to penetrate the body layer and to reach the drift layer. The trench includes an outer peripheral trench arranged to surround an active region when viewed two-dimensionally. A potential fixing region where the body layer is exposed is formed in one main surface opposite to the active region when viewed from the outer peripheral trench. The first interconnection is arranged to lie over the active region when viewed two-dimensionally. The potential fixing region is electrically connected to the first interconnection.

In the semiconductor device according to the present invention, an active region and a potential fixing region located outside the active region are formed. Then, the potential fixing region is electrically connected to the first interconnection arranged to lie over the active region. Therefore, in the semiconductor device according to the present invention, a potential of a semiconductor region located outside the active region can be fixed to a potential as high as the potential of the first interconnection. Consequently, according to the semiconductor device of the present invention, a semiconductor device excellent in breakdown voltage characteristics can be provided.

In a region of the drift layer in contact with the outer peripheral trench of the semiconductor device above, an electric field relaxing region having a second conductivity type may be formed. The electric field relaxing region may be connected to the potential fixing region.

Thus, a pn junction is formed at an interface between the electric field relaxing region and the region of the drift layer other than the electric field relaxing region, and a depletion layer extending from the pn junction is formed in the drift layer. Consequently, owing to an electric field relaxing effect of the depletion layer extending from the pn junction, electric field applied to the first insulating film arranged on a wall surface of the outer peripheral trench can be relaxed. In addition, as the electric field relaxing region is connected to the potential fixing region fixed to a potential as high as a potential of the first interconnection, a potential thereof is fixed.

The semiconductor device above may further include a second insulating film arranged above the potential fixing region and a second interconnection arranged above the second insulating film. The potential fixing region may include a potential fixing region extension portion extending to a portion below the first interconnection. The gate electrode may include a gate electrode extension portion extending to a portion below the second interconnection. The potential fixing region may electrically be connected to the first interconnection in the potential fixing region extension portion. The gate electrode may electrically be connected to the second interconnection in the gate electrode extension portion.

The semiconductor device above may further include a second insulating film arranged above the potential fixing region and a second interconnection arranged above the second insulating film. The first interconnection may include a first interconnection extension portion extending beyond the outer peripheral trench to the potential fixing region. The second interconnection may include a second interconnection extension portion extending beyond the outer peripheral trench to the gate electrode. The first interconnection may electrically be connected to the potential fixing region in the first interconnection extension portion. The second interconnection may electrically be connected to the gate electrode in the second interconnection extension portion.

By doing so, electrical connection between the second interconnection arranged above the potential fixing region and the gate electrode can readily be achieved while a potential of the potential fixing region is fixed to the potential of the first interconnection.

In the semiconductor device above, an angle formed between a sidewall surface of the trench and one main surface may be from 100° to 160°. By thus gently forming a sidewall surface of the trench, electric field concentration around a trench bottom can be suppressed. It is noted that an angle formed between a sidewall surface of the trench and one main surface means an angle formed between a sidewall surface of the trench and one main surface in the semiconductor substrate.

In the semiconductor device above, the semiconductor substrate may be composed of silicon carbide. Thus, the semiconductor device according to the present invention can suitably be employed in a silicon carbide semiconductor device having the semiconductor substrate composed of silicon carbide.

A method of manufacturing a semiconductor device according to the present invention includes the steps of preparing a semiconductor substrate including a drift layer having a first conductivity type and a body layer having a second conductivity type, which is formed on the drift layer to include one main surface, forming a trench to open on a side of one main surface and to penetrate the body layer and reach the drift layer, forming a first insulating film to include a wall surface of the trench, forming a gate electrode to be in contact with the first insulating film, and forming a first interconnection on one main surface. In the step of forming a trench, an outer peripheral trench arranged to surround an active region when viewed two-dimensionally is formed. In the step of forming a first interconnection, the first interconnection is formed to lie over the active region when viewed two-dimensionally and to electrically be connected to a potential fixing region which is the body layer exposed at one main surface opposite to the active region when viewed from the outer peripheral trench.

According to the method of manufacturing a semiconductor device of the present invention, the semiconductor device according to the present invention above, in which a potential at a surface portion of a semiconductor layer located outside an active region is fixed, can be manufactured.

In the method of manufacturing a semiconductor device above, in the step of forming a trench, the outer peripheral trench may be formed simultaneously with the trench other than the outer peripheral trench. Thus, the step above can more efficiently be performed.

The method of manufacturing a semiconductor device above may further include the step of forming an electric field relaxing region having the second conductivity type, which extends to be in contact with the outer peripheral trench in the drift layer and to reach the potential fixing region. In the step of forming an electric field relaxing region, the electric field relaxing region may be formed through ion implantation.

Thus, a semiconductor device capable of relaxing electric field applied to the first insulating film arranged on a wall surface of the outer peripheral trench can readily be manufactured.

In the method of manufacturing a semiconductor device above, in the step of preparing a semiconductor substrate, a semiconductor substrate composed of silicon carbide may be prepared. Thus, the method of manufacturing a semiconductor device according to the present invention can suitably be employed in a method of manufacturing a silicon carbide semiconductor device including a semiconductor substrate composed of silicon carbide.

As is clear from the description above, according to the semiconductor device of the present invention, breakdown voltage characteristics can be improved by fixing a potential at a surface portion of a semiconductor layer located outside an active region. In addition, according to the method of manufacturing a semiconductor device of the present invention, the semiconductor device according to the present invention above can be manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
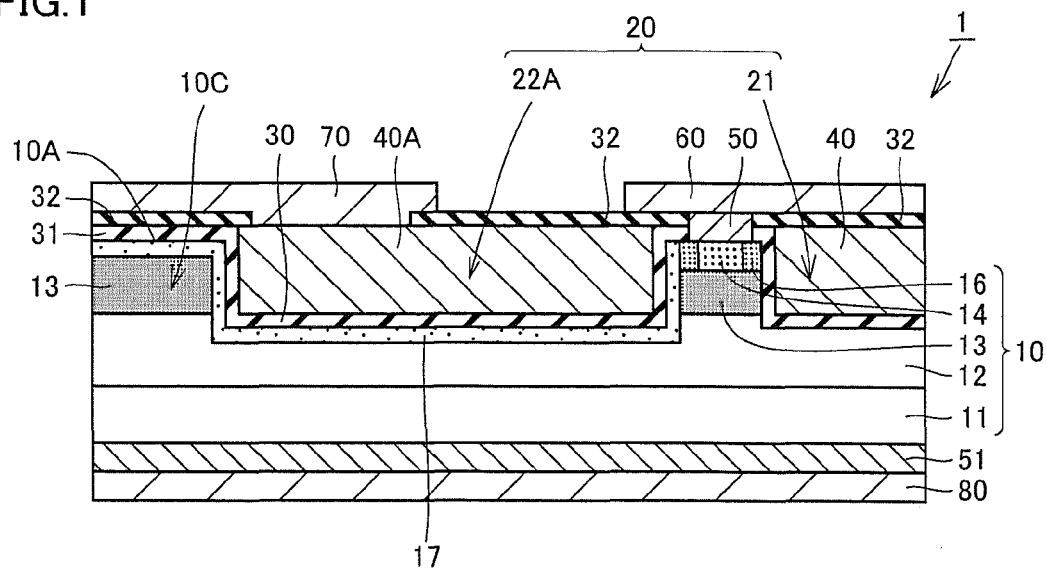
FIG. 1 is a schematic diagram showing a cross-sectional structure of a MOSFET along the line A-A in FIG. 4.

An embodiment of the present invention will be described hereinafter with reference to the drawings. It is noted that, in the drawings below, the same or corresponding elements have the same reference characters allotted and description thereof will not be repeated.

First Embodiment

Figure 3:
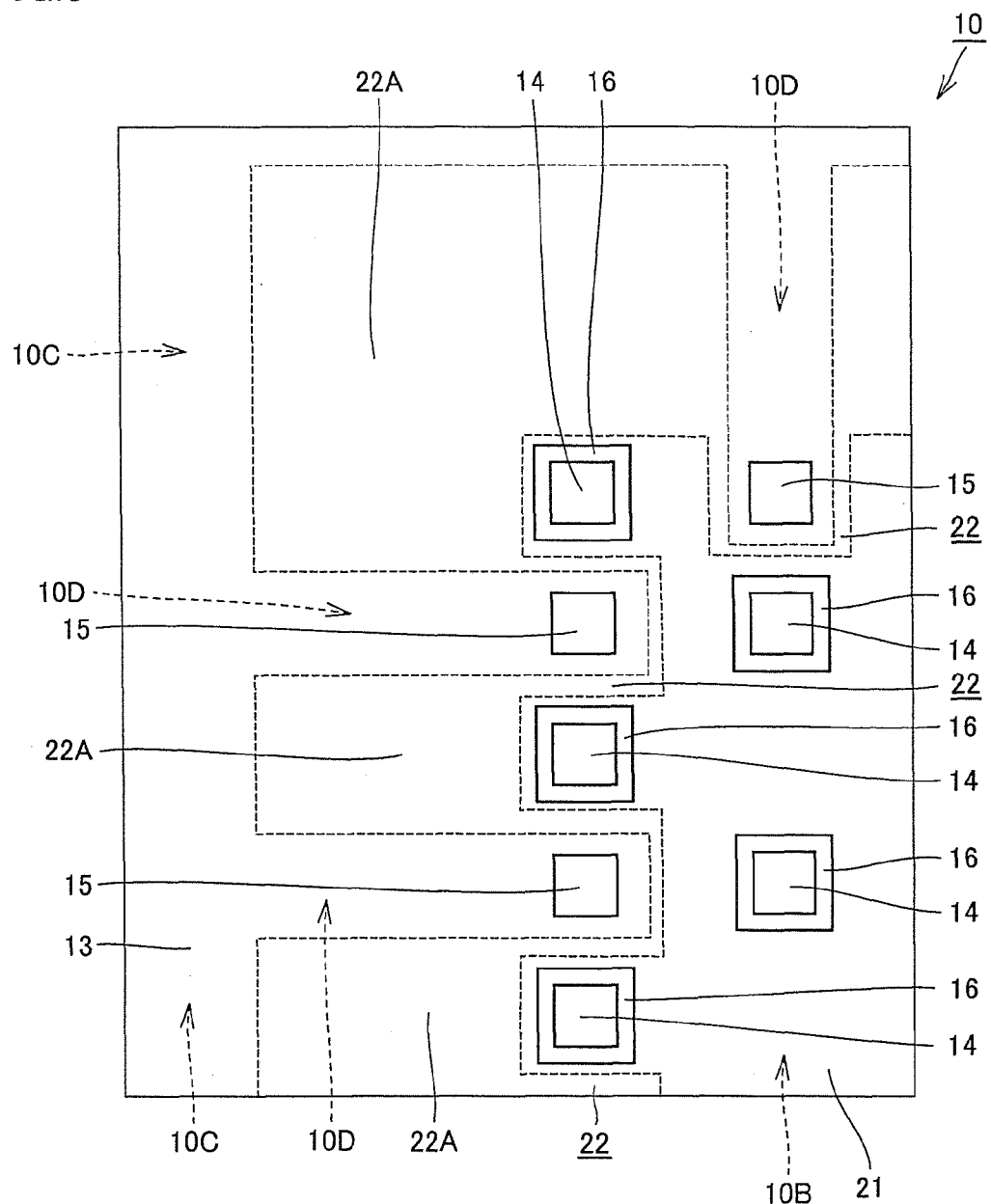
FIG. 3 is a schematic top view partially showing a structure of the MOSFET.
Figure 4:
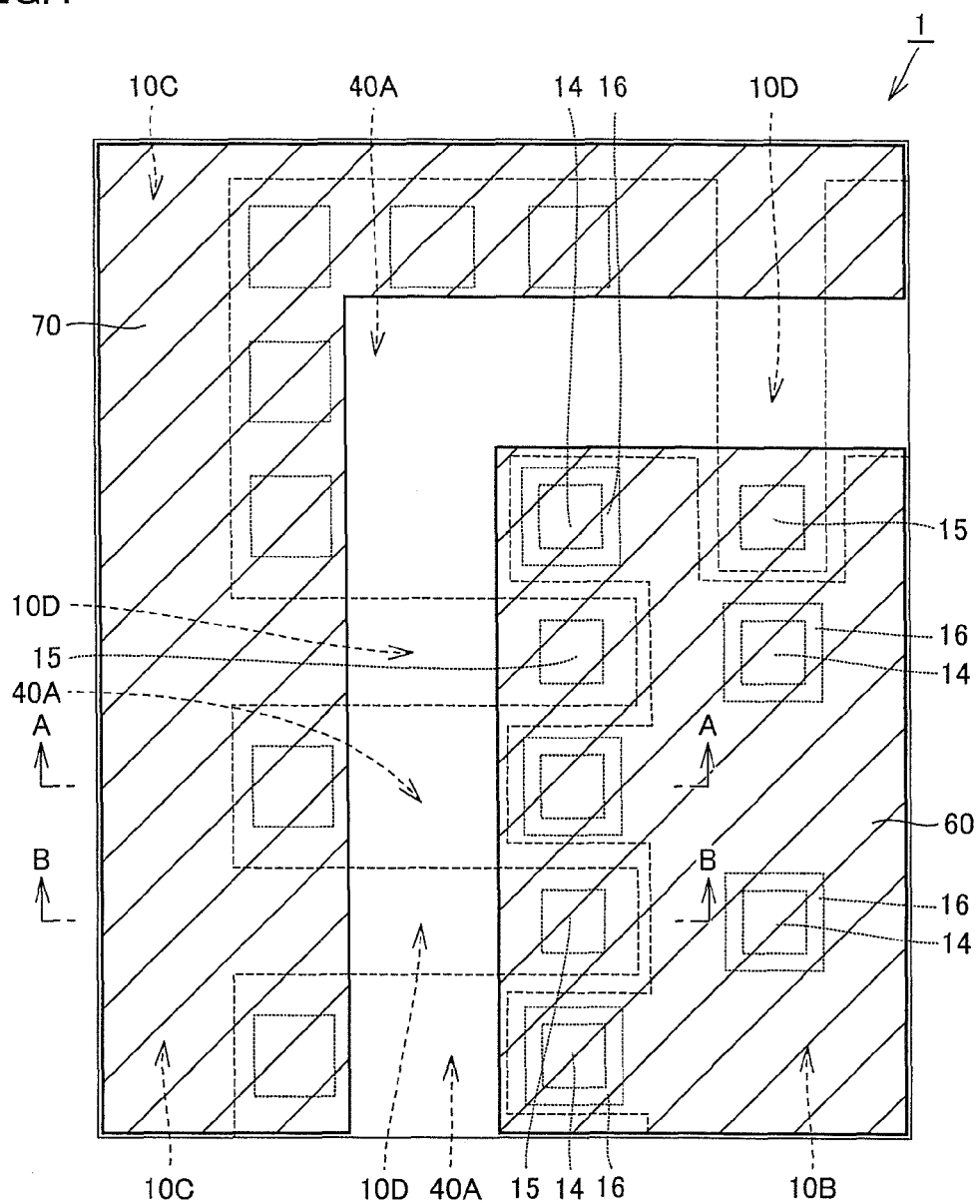
FIG. 4 is a schematic top view partially showing a structure of the MOSFET.

A semiconductor device and a semiconductor device manufacturing method according to a first embodiment of the present invention will initially be described. First, a structure of a MOSFET 1 as a semiconductor device according to the present embodiment will be described with reference to FIGS. 1 to 4. Here, FIG. 3 is a top view of a semiconductor substrate 10 included in MOSFET 1. In addition, FIG. 4 is a top view partially showing a structure of MOSFET 1.

Figure 2:
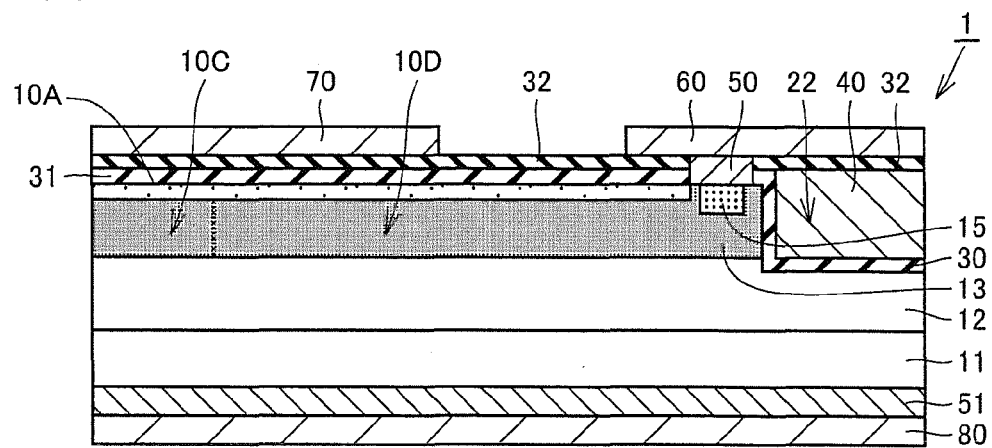
FIG. 2 is a schematic diagram showing a cross-sectional structure of the MOSFET along the line B-B in FIG. 4.

Referring to FIGS. 1 and 2, MOSFET 1 includes semiconductor substrate 10 having a main surface 10A, a gate oxide film 30 serving as a first insulating film, a protection oxide film 31 serving as a second insulating film, a gate electrode 40, an interlayer insulating film 32, a source electrode 50, a drain electrode 51, a source interconnection 60 serving as a first interconnection, a gate interconnection 70 serving as a second interconnection, and a drain pad electrode 80. Semiconductor substrate 10 includes a base substrate 11, a drift layer 12, a body layer 13, contact regions 14, 15, and a source region 16. In addition, semiconductor substrate 10 may be composed of silicon carbide.

A trench 20 opening on a side of main surface 10A is formed in semiconductor substrate 10. Trench 20 is formed to extend across body layer 13 and drift layer 12, specifically to penetrate body layer 13 and to reach drift layer 12.

An angle formed between a sidewall surface of trench 20 and main surface 10A may be from 100° to 160°. By thus gently forming a sidewall surface of trench 20, electric field concentration around a bottom of trench 20 can be suppressed. More specifically, in FIGS. 1 and 2, an example where an angle formed between the sidewall surface of trench 20 and main surface 10A is 90° is shown, however, by setting this angle to 100° to 160°, an angle formed between the sidewall surface of trench 20 and a bottom surface formed in parallel to main surface 10A is also from 100° to 160°. By thus setting an angle formed between the sidewall surface of trench 20 and the bottom surface to an obtuse angle, electric field concentration around the bottom of trench 20 can be suppressed. It is noted that an angle formed between the sidewall surface of trench 20 and main surface 10A means an angle formed between the sidewall surface of trench 20 and main surface 10A in semiconductor substrate 10.

Drift layer 12 is formed on one main surface of base substrate 11. Base substrate 11 and drift layer 12 contain such an n-type impurity as P (phosphorus), and a concentration value thereof is higher in base substrate 11 than in drift layer 12. Body layer 13 is formed to include the sidewall surface of trench 20 and to extend in contact with drift layer 12. A p-type impurity contained in body layer 13 is, for example, Al (aluminum), B (boron), or the like.

Source region 16 is formed to include main surface 10A on a side opposite to drift layer 12 when viewed from body layer 13. Source region 16 is formed to include the sidewall surface of trench 20 and to be in contact with body layer 13. An n-type impurity contained in source region 16 is, for example, P (phosphorus) or the like, and a concentration value thereof is higher than that in drift layer 12.

Contact regions 14, 15 are formed to include main surface 10A, while they are in contact with body layer 13. In addition, contact region 14 is formed adjacent to source region 16. A p-type impurity contained in contact regions 14, 15 is, for example, Al, B, or the like, and a concentration value thereof is higher than that in body layer 13.

Referring to FIG. 3, when viewed two-dimensionally from above main surface 10A of semiconductor substrate 10, trench 20 includes an outer peripheral trench 22 arranged to surround an active region 10B and an inner trench 21 defined as trench 20 other than outer peripheral trench 22. Active region 10B is a region where contact region 14 and source region 16 are formed in a region including main surface 10A. This active region 10B operates as a device. In addition, in main surface 10A located opposite to active region 10B when viewed from outer peripheral trench 22, that is, outside of active region 10B, a potential fixing region 10C where body layer 13 is exposed is formed. In a region of potential fixing region 10C including main surface 10A, contact region 15 is formed. In addition, potential fixing region 10C is formed to include a potential fixing region extension portion 10D extending toward active region 10B when viewed two-dimensionally. Moreover, outer peripheral trench 22 is formed to include an outer peripheral trench extension portion 22A extending toward potential fixing region 10C along potential fixing region extension portion 10D in such a manner that outer peripheral trench extension portion 22A and potential fixing region extension portion 10D are staggered.

Referring to FIGS. 1 and 2, gate oxide film 30 is arranged on and in contact with the wall surface of trench 20. Protection oxide film 31 is arranged above potential fixing region 10C, in contact with main surface 10A. Gate oxide film 30 and protection oxide film 31 are composed, for example, of silicon dioxide ($SiO_2$).

Gate electrode 40 is arranged on and in contact with gate oxide film 30. More specifically, gate electrode 40 is formed to bury trench 20 on which gate oxide film 30 is formed. In addition, gate electrode 40 includes a gate electrode extension portion 40A formed to bury outer peripheral trench extension portion 22A. Gate electrode 40 is composed, for example, of such a conductor as Al or polysilicon to which an impurity has been added.

Source electrode 50 is arranged on main surface 10A, to be in contact with contact region 14 or contact region 15 and source region 16. Source electrode 50 is made of a material capable of establishing ohmic contact with source region 16, such as $Ni_xSi_y$ (nickel silicide), $Ti_xSi_y$ (titanium silicide), $Al_xSi_y$ (aluminum silicide), and $Ti_xAl_ySi_z$ (titanium aluminum silicide), and electrically connected to source region 16.

Drain electrode 51 is arranged in contact with a main surface opposite to drift layer 12 when viewed from base substrate 11. Drain electrode 51 is made of a material capable of establishing ohmic contact with base substrate 11, such as a material similar to that for source electrode 50, and electrically connected to base substrate 11.

Interlayer insulating film 32 is arranged on and in contact with gate electrode 40 and protection oxide film 31, and it electrically isolates gate electrode 40 from source electrode 50. Interlayer insulating film 32 is composed, for example, of silicon dioxide ($SiO_2$).

Referring to FIGS. 1 and 4, source interconnection 60 is arranged to lie over active region 10B when viewed two-dimensionally. Specifically, source interconnection 60 is made, for example, of such a conductor as Al, and it is electrically connected to source region 16 through source electrode 50. In addition, referring to FIGS. 2 and 4, potential fixing region 10C includes potential fixing region extension portion 10D extending to a portion below source interconnection 60, and it is electrically connected to source interconnection 60 in potential fixing region extension portion 10D. Specifically, potential fixing region 10C is electrically connected to source interconnection 60 through source electrode 50 in contact region 15 formed in potential fixing region extension portion 10D. Thus, a potential of potential fixing region 10C is fixed to a potential as high as that of source interconnection 60.

Referring to FIGS. 1, 2, and 4, gate interconnection 70 is arranged at a distance from source interconnection 60, to lie over potential fixing region 10C when viewed two-dimensionally. In addition, gate electrode 40 includes gate electrode extension portion 40A extending to a portion below gate interconnection 70, and it is electrically connected to gate interconnection 70 in gate electrode extension portion 40A. Gate interconnection 70 is made, for example, of a material similar to that for source interconnection 60. Furthermore, gate electrode extension portion 40A and potential fixing region extension portion 10D are formed alternately in a direction along an outer periphery of source interconnection 60 (a direction vertical to a sheet surface in FIGS. 1 and 2).

Referring to FIGS. 1 and 2, drain pad electrode 80 is arranged to cover drain electrode 51. Drain pad electrode 80 is made, for example, of a material similar to that for source interconnection 60 and gate interconnection 70, and it is electrically connected to base substrate 11 through drain electrode 51.

Namely, MOSFET 1 as the semiconductor device according to the present embodiment includes semiconductor substrate 10 having trench 20 formed in main surface 10A, gate oxide film 30 arranged on and in contact with the wall surface of trench 20, gate electrode 40 arranged on and in contact with gate oxide film 30, and source interconnection 60 arranged on main surface 10A. Semiconductor substrate 10 includes drift layer 12 having a p conductivity type and body layer 13 having an n conductivity type, which is arranged on the main surface 10A side when viewed from drift layer 12. Trench 20 is formed to penetrate body layer 13 and to reach drift layer 12. Trench 20 includes outer peripheral trench 22 arranged to surround active region 10B when viewed two-dimensionally. On main surface 10A opposite to active region 10B when viewed from outer peripheral trench 22, potential fixing region 10C where body layer 13 is exposed is formed. Source interconnection 60 is arranged to lie over active region 10B when viewed two-dimensionally. Potential fixing region 10C is electrically connected to source interconnection 60. Thus, MOSFET 1 is a semiconductor device having improved breakdown voltage characteristics, as a potential of potential fixing region 10C which is a semiconductor region located outside active region 10B is fixed to a potential as high as a potential of source interconnection 60.

In addition, in MOSFET 1 as the semiconductor device according to the present embodiment above, in a region of drift layer 12 in contact with outer peripheral trench 22, p-type electric field relaxing region 17 is formed. In addition, electric field relaxing region 17 is connected to potential fixing region 10C.

Though electric field relaxing region 17 is not an essential feature in the semiconductor device according to the present invention, by including electric field relaxing region 17, a pn junction is formed at an interface between electric field relaxing region 17 and a region of drift layer 12 other than electric field relaxing region 17, and in drift layer 12, a depletion layer extending from the pn junction is formed. Consequently, owing to an electric field relaxing effect of the depletion layer extending from the pn junction, electric field applied to gate oxide film 30 arranged on the wall surface of outer peripheral trench 22 can be relaxed. In addition, a potential of electric field relaxing region 17 is fixed by being connected to potential fixing region 10C fixed to a potential as high as a potential of source interconnection 60.

The semiconductor device manufacturing method according to the present embodiment will now be described with reference to FIGS. 1 to 15. Here, FIGS. 6, 8, 10, 12, and 14 partially show a cross-sectional structure of MOSFET 1 along the line A-A in FIG. 4, and FIGS. 7, 9, 11, 13, and 15 partially show a cross-sectional structure of MOSFET 1 along the line B-B in FIG. 4. In addition, in the semiconductor device manufacturing method according to the present embodiment, MOSFET 1 as the semiconductor device according to the present embodiment above is manufactured.

Figure 5:
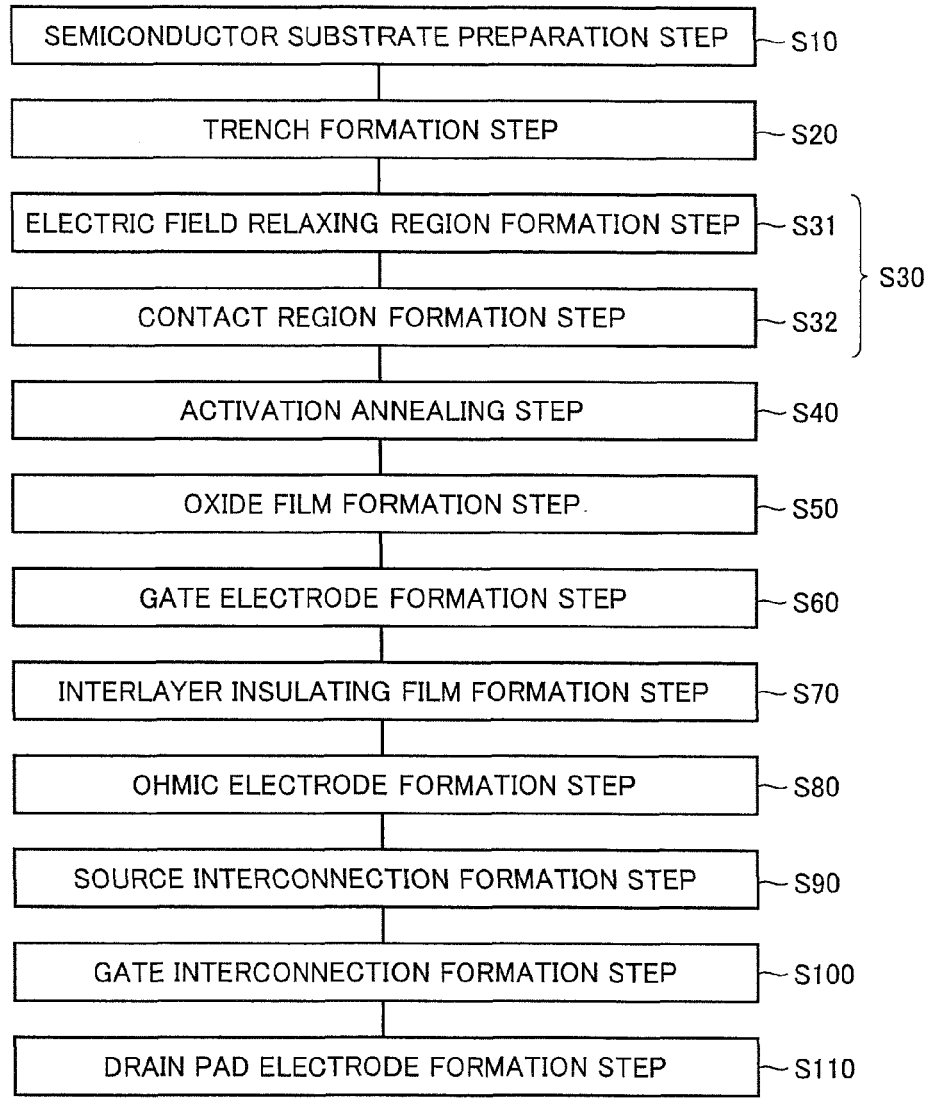
FIG. 5 is a flowchart schematically showing a method of manufacturing a MOSFET.
Figure 6:
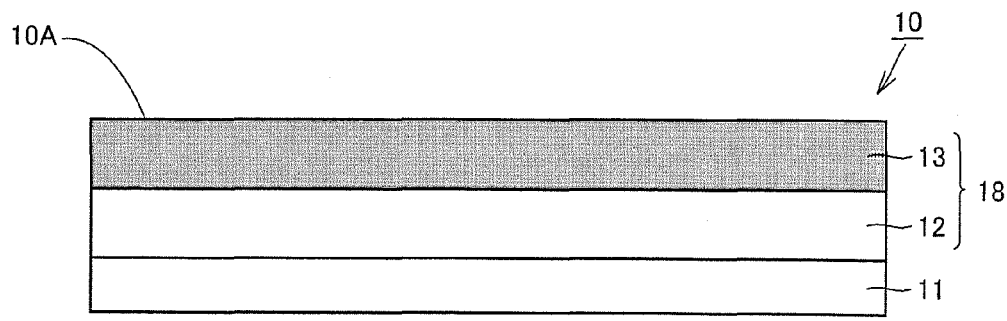
FIG. 6 is a schematic cross-sectional view for illustrating the method of manufacturing a MOSFET.
Figure 7:
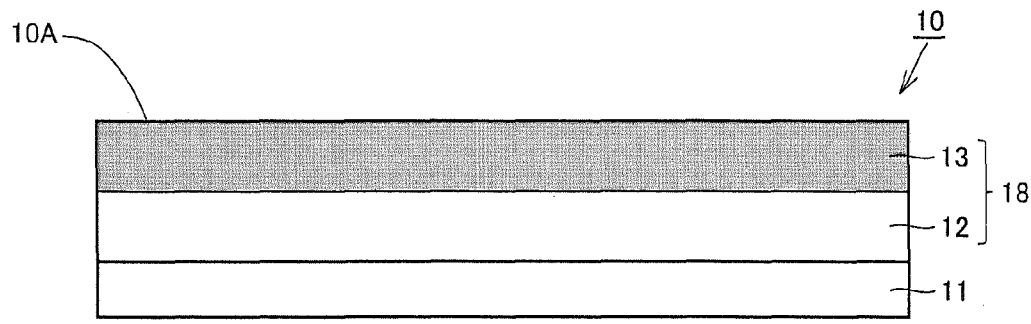
FIG. 7 is a schematic cross-sectional view for illustrating the method of manufacturing a MOSFET.
Figure 8:
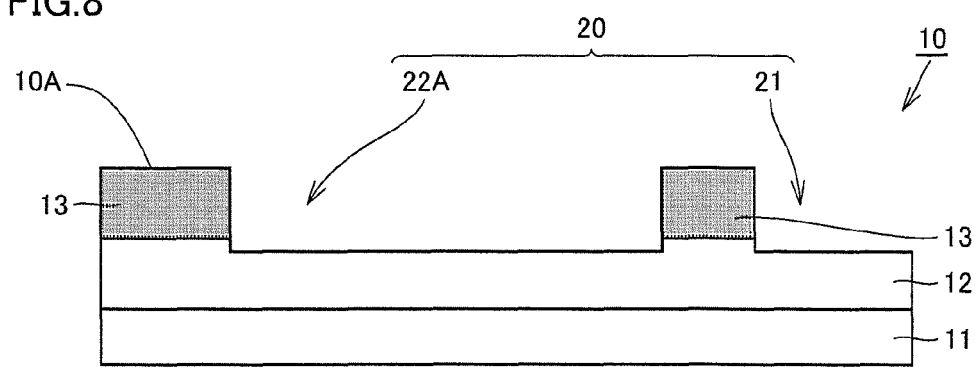
FIG. 8 is a schematic cross-sectional view for illustrating the method of manufacturing a MOSFET.
Figure 9:
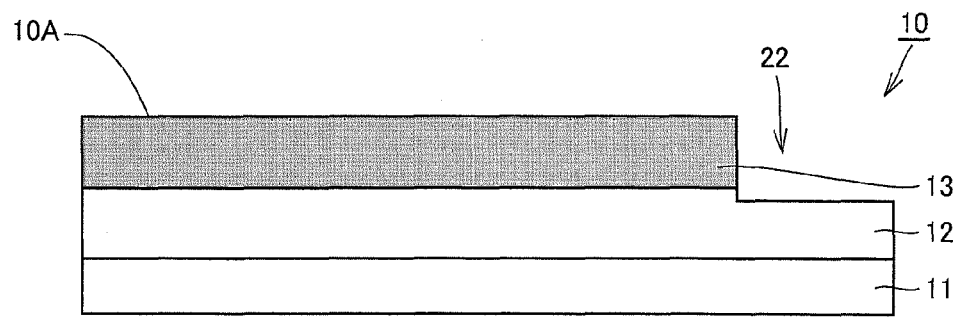
FIG. 9 is a schematic cross-sectional view for illustrating the method of manufacturing a MOSFET.

Referring to FIG. 5, initially, a semiconductor substrate preparation step is performed as a step (S10). In this step (S10), referring to FIGS. 6 and 7, initially, base substrate 11 is prepared. Then, for example, through epitaxial growth, a semiconductor layer 18 having the n conductivity type is formed on one main surface of base substrate 11. Then, for example, Al ions are implanted into a region of semiconductor layer 18 including a surface portion, to thereby form body layer 13. Then, a region of semiconductor layer 18 where body layer 13 was not formed serves as drift layer 12. Thus, semiconductor substrate 10 including drift layer 12 having the n conductivity type and body layer 13 having the p conductivity type, which is formed on drift layer 12 to include main surface 10A, is prepared. In addition, in this step (S10), semiconductor substrate 10 composed, for example, of silicon carbide is prepared.

Then, a trench formation step is performed as a step (S20). In this step (S20), referring to FIGS. 8 and 9, trench 20 opening on the main surface 10A side is formed in semiconductor substrate 10. Specifically, for example, with an etching method such as RIE (Reactive Ion Etching) or thermal etching or combination thereof, trench 20 is formed to penetrate body layer 13 and to reach drift layer 12. In addition, referring to FIG. 3, in this step (S20), when viewed two-dimensionally from above main surface 10A of semiconductor substrate 10, outer peripheral trench 22 arranged to surround a region where active region 10B should be formed in a subsequent step (S30) and inner trench 21 which is trench 20 other than outer peripheral trench 22, arranged in the region above where active region 10B should be formed, are formed. Outer peripheral trench 22 is formed to have an outer peripheral trench extension portion 22A protruding toward a region where potential fixing region 10C should be formed in the subsequent step (S30) when viewed two-dimensionally.

In addition, in this step (S20), outer peripheral trench 22 may be formed simultaneously with inner trench 21. Thus, the step above can more efficiently be performed.

Then, an ion implantation step is performed as the step (S30). In this step (S30), an electric field relaxing region formation step as a step (S31) and a contact region formation step as a step (S32) are performed.

Figure 10:
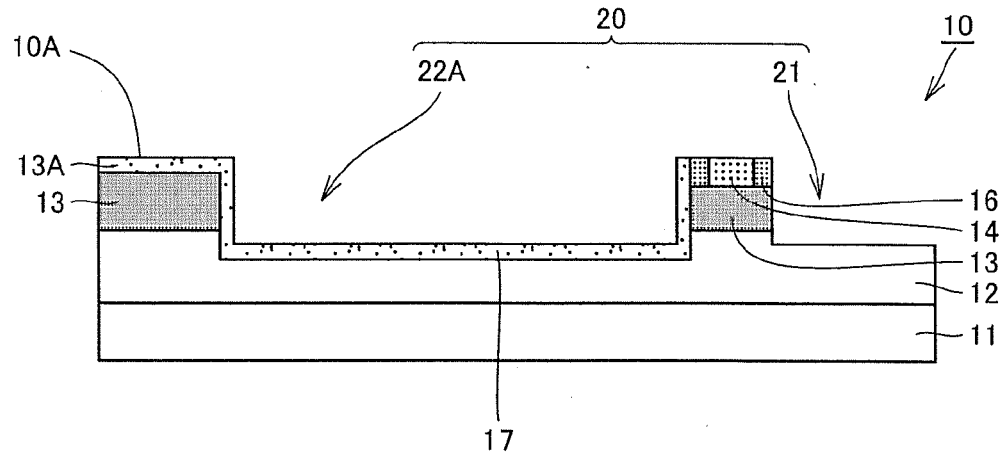
FIG. 10 is a schematic cross-sectional view for illustrating the method of manufacturing a MOSFET.
Figure 11:
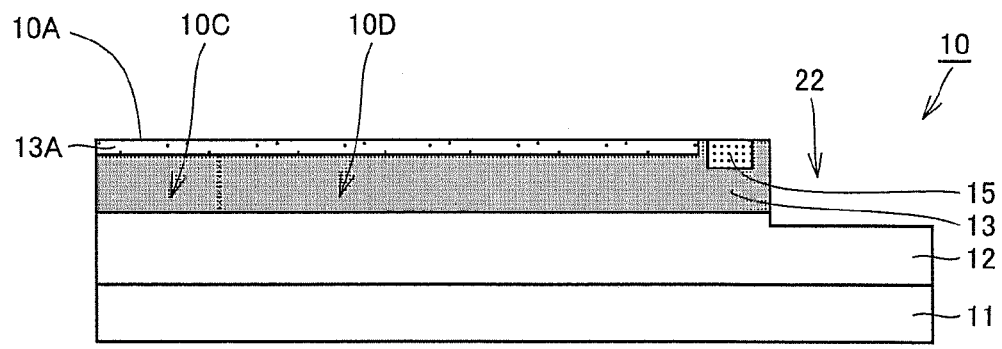
FIG. 11 is a schematic cross-sectional view for illustrating the method of manufacturing a MOSFET.
Figure 12:
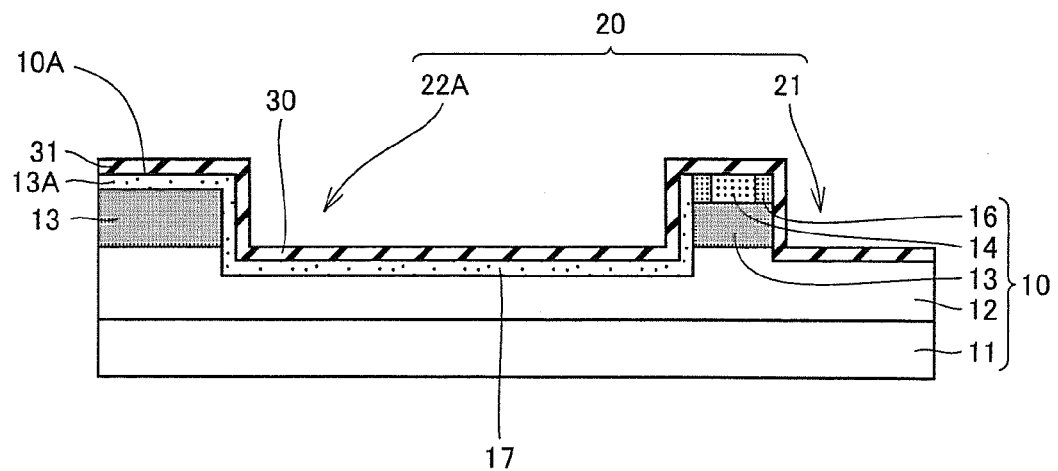
FIG. 12 is a schematic cross-sectional view for illustrating the method of manufacturing a MOSFET.
Figure 13:
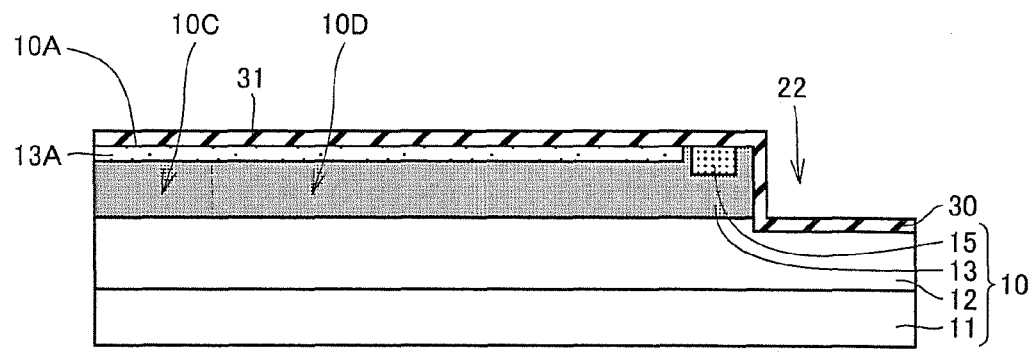
FIG. 13 is a schematic cross-sectional view for illustrating the method of manufacturing a MOSFET.
Figure 14:
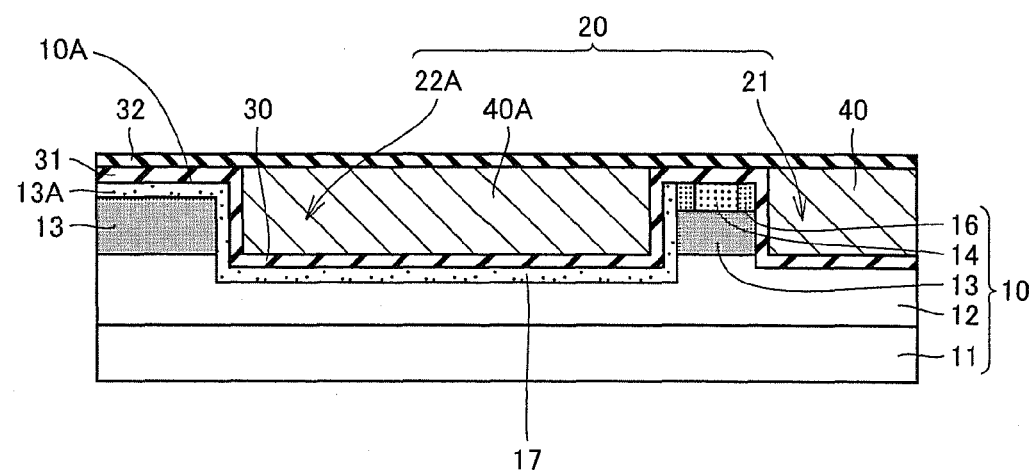
FIG. 14 is a schematic cross-sectional view for illustrating the method of manufacturing a MOSFET.
Figure 15:
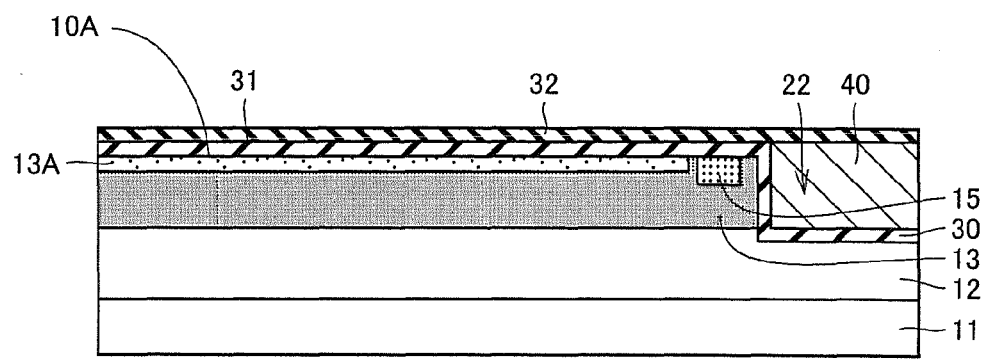
FIG. 15 is a schematic cross-sectional view for illustrating the method of manufacturing a MOSFET.

Referring to FIGS. 10 and 11, initially, in the step (S31), for example, Al ions are implanted into a region including main surface 10A of semiconductor substrate 10 and a wall surface of outer peripheral trench extension portion 22A. Thus, a region 13A higher in p-type impurity concentration than body layer 13 is formed in a region including main surface 10A, and electric field relaxing region 17 having the p conductivity type and extending to be in contact with outer peripheral trench 22 is formed in drift layer 12.

Then, in the step (S32), initially, for example, P ions are implanted into a region including main surface 10A to thereby form source region 16. Then, for example, Al ions are further implanted into a region including main surface 10A to thereby form contact regions 14, 15. Thus, in semiconductor substrate 10, active region 10B including contact region 14 and source region 16 and potential fixing region 10C including contact region 15, where body layer 13 is exposed, are formed (see FIG. 3). In addition, since outer peripheral trench 22 is formed to have outer peripheral trench extension portion 22A in the step (S20) above, potential fixing region 10C is formed to include potential fixing region extension portion 10D extending toward active region 10B.

Then, an activation annealing step is performed as a step (S40). In this step (S40), by heating semiconductor substrate 10, an impurity introduced in the step (S30) above is activated. Thus, desired carriers are generated in the region where the impurity has been introduced.

Then, an oxide film formation step is performed as a step (S50). In this step (S50), referring to FIGS. 12 and 13, as semiconductor substrate 10 is heated in an atmosphere containing, for example, oxygen, gate oxide film 30 and protection oxide film 31 composed of silicon dioxide ($SiO_2$) are formed across a region including the wall surface of trench 20 and main surface 10A.

Then, a gate electrode formation step is performed as a step (S60). In this step (S60), referring to FIGS. 14 and 15, for example, with LPCVD (Low Pressure Chemical Vapor Deposition), a polysilicon film is formed to bury trench 20. Thus, gate electrode 40 in contact with gate oxide film 30 is formed. In addition, since gate electrode 40 is formed to bury outer peripheral trench extension portion 22A in this step (S60), it is formed to include gate electrode extension portion 40A extending toward potential fixing region 10C.

An interlayer insulating film formation step is performed as a step (S70). In this step (S70), for example, with P (Plasma)-CVD, interlayer insulating film 32 composed of silicon dioxide ($SiO_2$) which is an insulator is formed on and in contact with gate electrode 40 and protection oxide film 31.

Then, an ohmic electrode formation step is performed as a step (S80). Referring to FIGS. 1 and 2, in this step (S80), initially, for example, with such an etching method as RIE, interlayer insulating film 32 and protection oxide film 31 are partially removed, to thereby form a contact hole where contact regions 14, 15 and source region 16 are exposed. Then, for example, with a vapor deposition method, a film composed of Ni is formed in the contact hole above. Meanwhile, a film composed of Ni is similarly formed on the main surface of base substrate 11 opposite to the side where drift layer 12 is formed. Thereafter, alloying heating treatment is performed, so that at least a part of the film composed of Ni above is converted to silicide to thereby form source electrode 50 and drain electrode 51.

Then, a source interconnection formation step is performed as a step (S90). In this step (S90), referring to FIGS. 1, 2, and 4, for example, with the vapor deposition method, source interconnection 60 composed of Al which is a conductor is formed to lie over active region 10B and potential fixing region extension portion 10D.

Then, a gate interconnection formation step is performed as a step (S100). In this step (S100), for example, with the vapor deposition method, gate interconnection 70 composed of Al is formed to lie over potential fixing region 10C and gate electrode extension portion 40A.

Then, a drain pad electrode formation step is performed as a step (S110). In this step (S110), for example, with the vapor deposition method, drain pad electrode 80 composed of Al is formed to cover drain electrode 51. By performing the steps (S10) to (S110) above, MOSFET 1 is manufactured and the semiconductor device manufacturing method according to the present embodiment is completed. Thus, according to the semiconductor device manufacturing method in the present embodiment, MOSFET 1 as the semiconductor device according to the present embodiment above capable of fixing a potential at the surface portion of the semiconductor layer located outside the active region can be manufactured.

Second Embodiment

Figure 16:
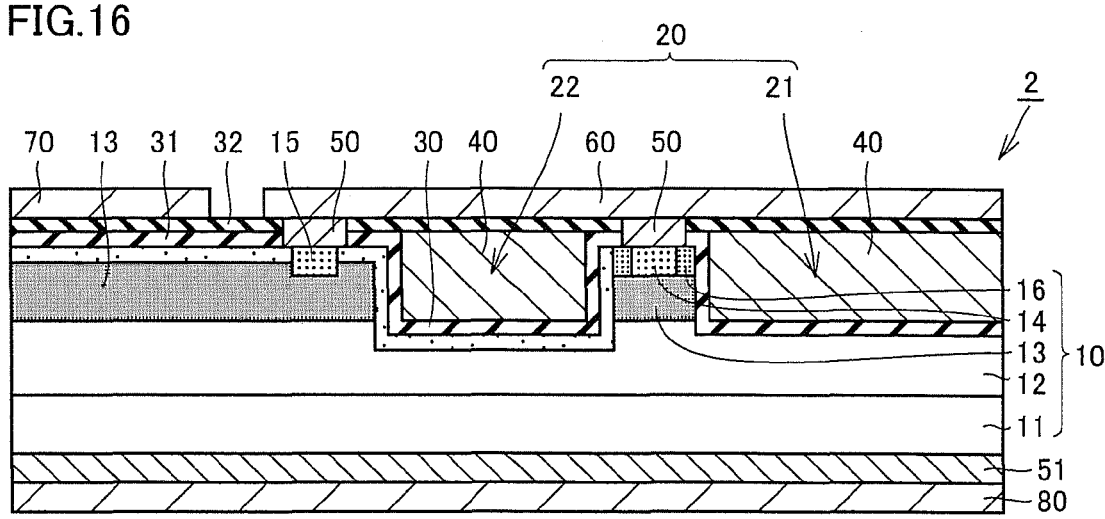
FIG. 16 is a schematic diagram showing a cross-sectional structure of a MOSFET along the line C-C in FIG. 19.
Figure 17:
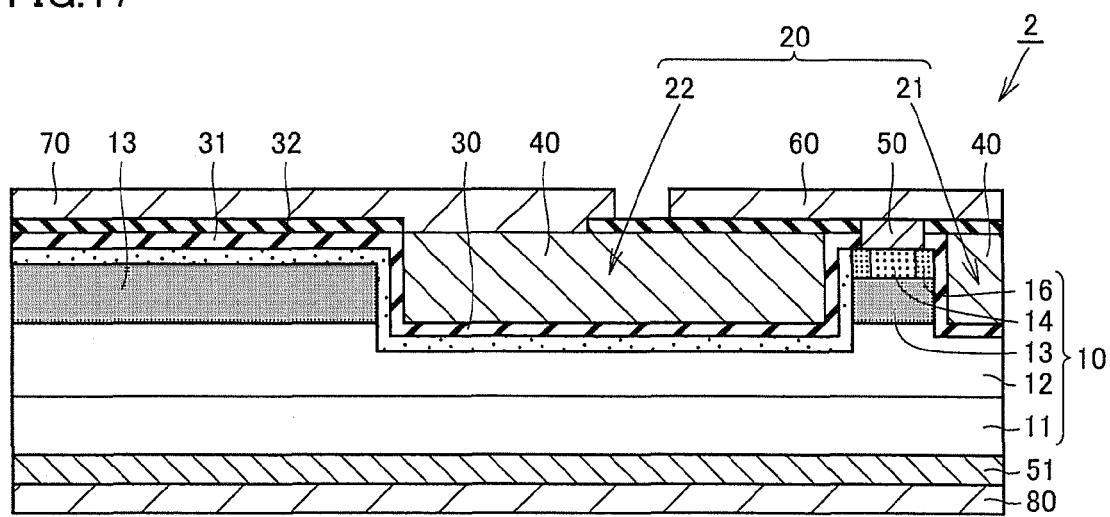
FIG. 17 is a schematic diagram showing a cross-sectional structure of the MOSFET along the line D-D in FIG. 19.
Figure 18:
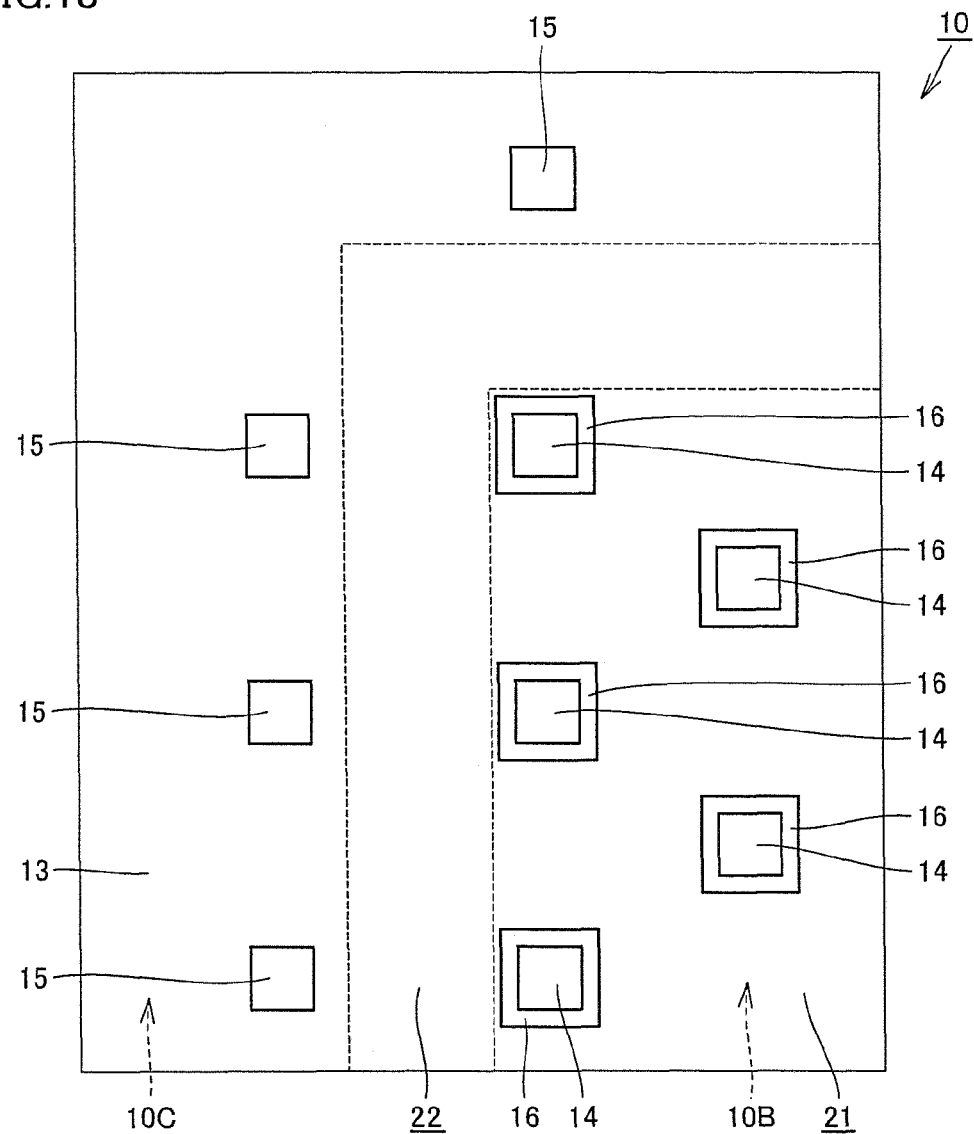
FIG. 18 is a schematic top view partially showing a structure of a MOSFET according to a second embodiment.
Figure 19:
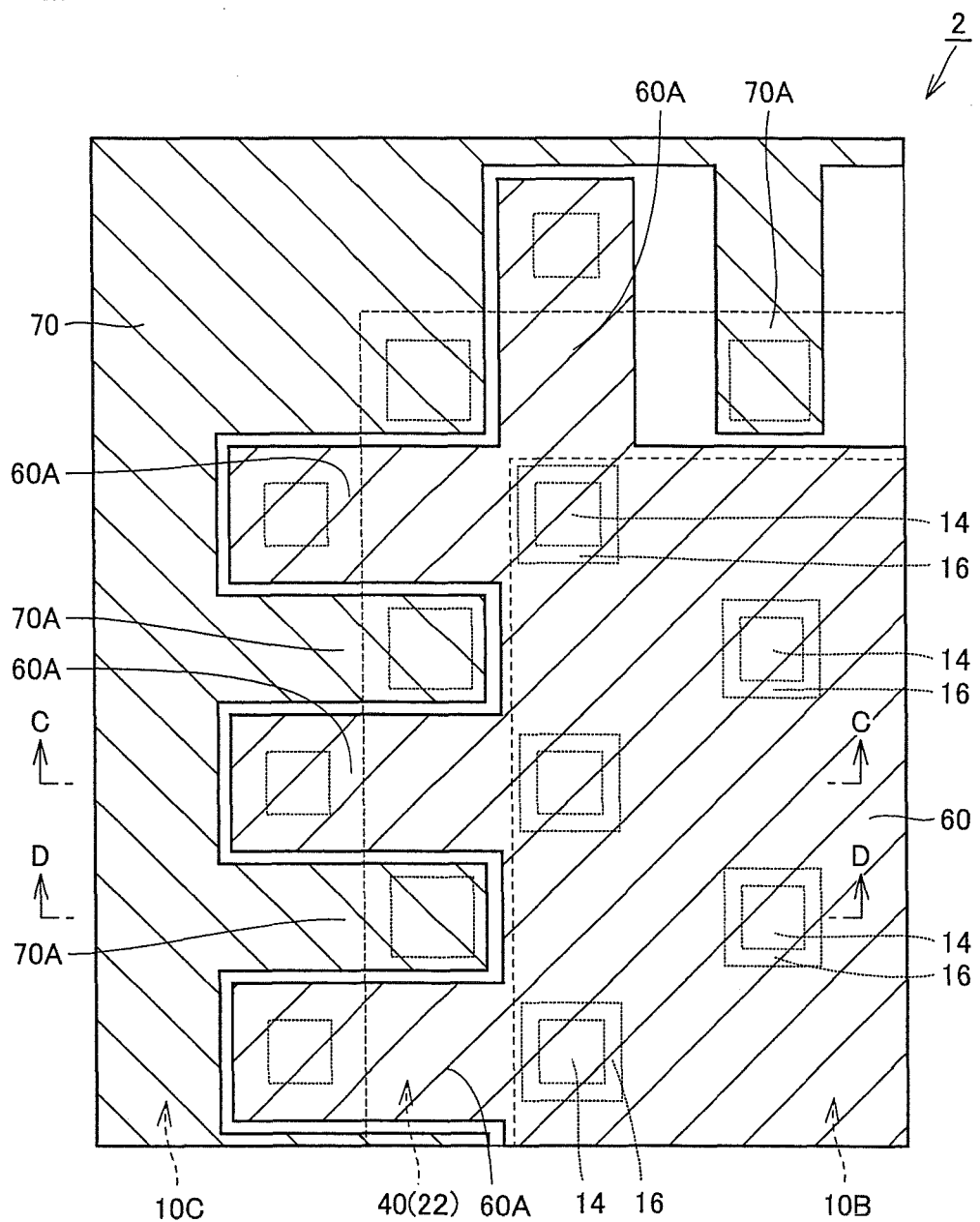
FIG. 19 is a schematic top view partially showing a structure of the MOSFET according to the second embodiment.

A semiconductor device and a semiconductor device manufacturing method according to a second embodiment of the present invention will now be described. Initially, a structure of a MOSFET 2 as the semiconductor device according to the present embodiment will be described with reference to FIGS. 16 to 19. Here, FIG. 18 is a plan view showing a top surface of semiconductor substrate 10 provided in MOSFET 2. In addition, FIG. 19 is a plan view showing a top surface of MOSFET 2. Referring to FIGS. 16 and 17, MOSFET 2 is basically the same in structure and effect as MOSFET 1 as the semiconductor device according to the first embodiment above. MOSFET 2, however, is different from MOSFET 1 in connection between the potential fixing region and the source interconnection and connection between the gate electrode and the gate interconnection.

Referring to FIG. 19, source interconnection 60 is arranged to lie over active region 10B when viewed two-dimensionally and is electrically connected to source region 16 through source electrode 50, as in the first embodiment. Here, in the present embodiment, source interconnection 60 includes a source interconnection extension portion 60A serving as a first interconnection extension portion extending beyond outer peripheral trench 22 to potential fixing region 10C and it is electrically connected to potential fixing region 10C in source interconnection extension portion 60A.

Gate interconnection 70 is arranged to lie over potential fixing region 10C when viewed two-dimensionally, as in the first embodiment. Here, in the present embodiment, gate interconnection 70 includes a gate interconnection extension portion 70A serving as a second interconnection extension portion extending beyond outer peripheral trench 22 to gate electrode 40 and it is electrically connected to gate electrode 40 in gate interconnection extension portion 70A.

Then, a semiconductor device manufacturing method according to the present embodiment will be described with reference to FIGS. 5 and 16 to 29. Here, FIGS. 20, 22, 24, 26, and 28 partially show a cross-sectional structure of MOSFET 2 along the line C-C in FIG. 19, and FIGS. 21, 23, 25, 27, and 29 partially show a cross-sectional structure of MOSFET 2 along the line D-D in FIG. 19. The semiconductor device manufacturing method according to the present embodiment is basically performed in the steps the same as those in the semiconductor device manufacturing method according to the first embodiment, and achieves the same effect. In addition, in the semiconductor device manufacturing method according to the present embodiment, MOSFET 2 as the semiconductor device according to the present embodiment above is manufactured.

Figure 20:
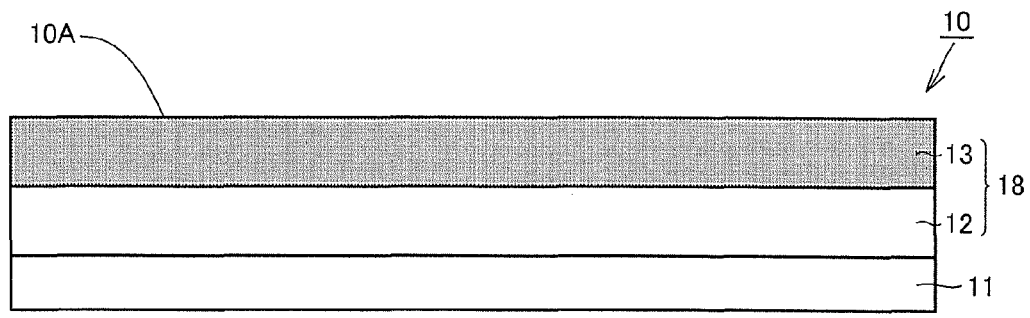
FIG. 20 is a schematic cross-sectional view for illustrating a method of manufacturing a MOSFET according to the second embodiment.
Figure 21:
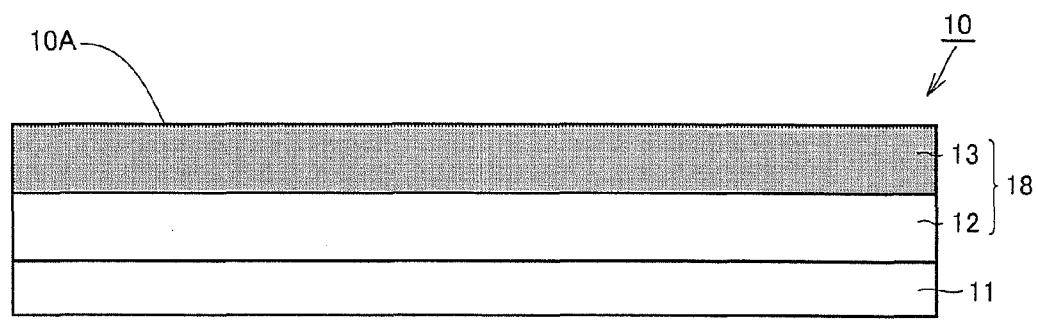
FIG. 21 is a schematic cross-sectional view for illustrating the method of manufacturing a MOSFET according to the second embodiment.

Referring to FIG. 5, initially, the semiconductor substrate preparation step is performed as the step (S10). Referring to FIGS. 20 and 21, in this step (S10), as in the first embodiment, semiconductor substrate 10 including base substrate 11, drift layer 12, and body layer 13 is prepared.

Figure 22:
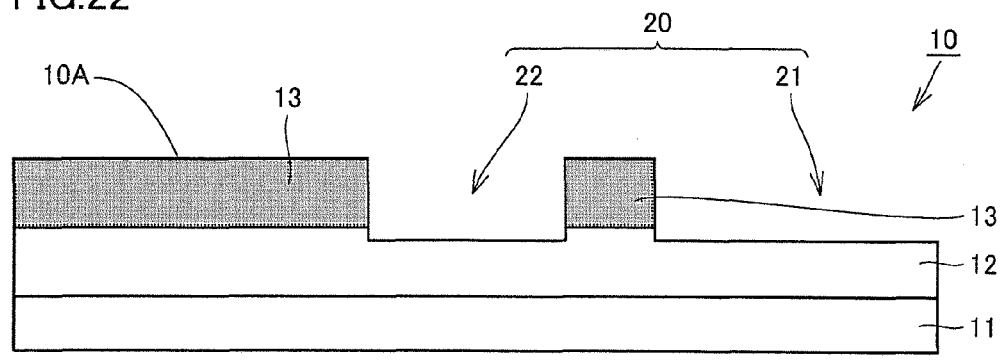
FIG. 22 is a schematic cross-sectional view for illustrating the method of manufacturing a MOSFET according to the second embodiment.
Figure 23:
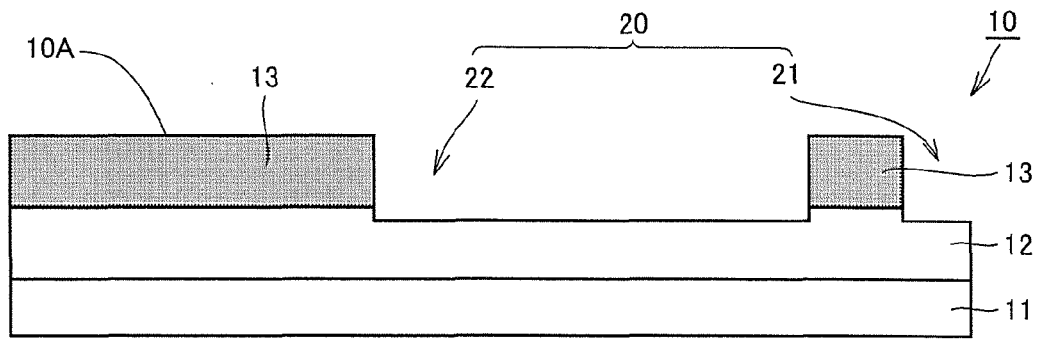
FIG. 23 is a schematic cross-sectional view for illustrating the method of manufacturing a MOSFET according to the second embodiment.

Then, the trench formation step is performed as the step (S20). Referring to FIGS. 22 and 23, in this step (S20), as in the first embodiment, trench 20 opening on the main surface 10A side and penetrating body layer 13 to reach drift layer 12 is formed in semiconductor substrate 10. In addition, referring to FIG. 18, in this step (S20), outer peripheral trench 22 surrounding an outer periphery of a region where active region 10B should be formed in the subsequent step (S30) and inner trench 21 which is trench 20 other than outer peripheral trench 22, arranged in the region above where active region 10B should be formed, are formed. Here, in the present embodiment, outer peripheral trench 22 is formed without extending toward the region where potential fixing region 10C should be formed in the subsequent step (S30).

Then, the ion implantation step is performed as the step (S30). In this step (S30), as in the first embodiment, the electric field relaxing region formation step as the step (S31) and the contact region formation step as the step (S32) are performed.

Figure 24:
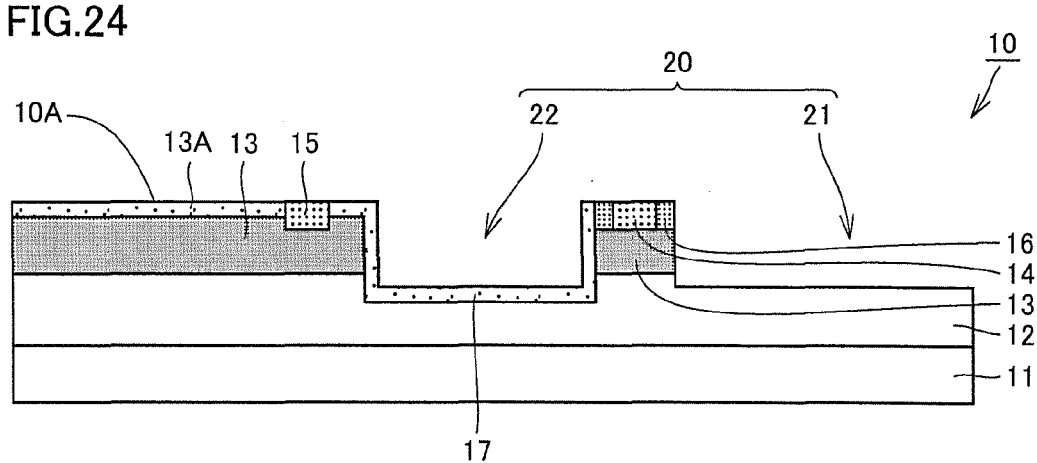
FIG. 24 is a schematic cross-sectional view for illustrating the method of manufacturing a MOSFET according to the second embodiment.
Figure 25:
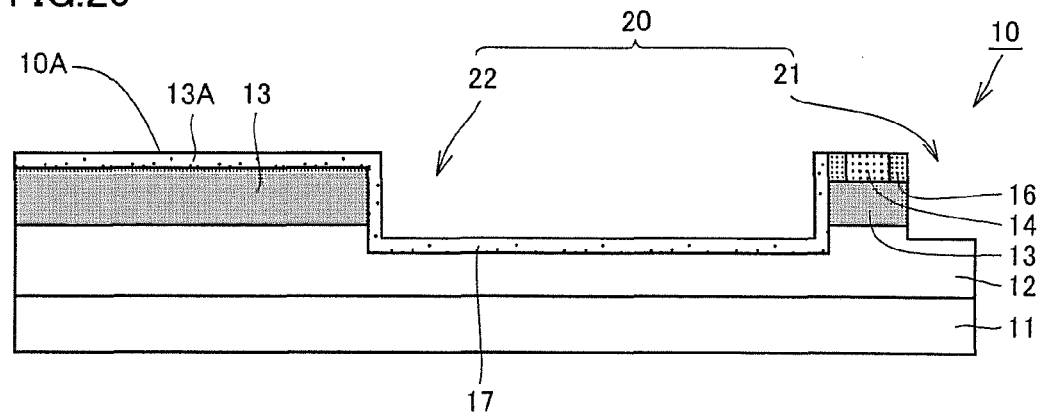
FIG. 25 is a schematic cross-sectional view for illustrating the method of manufacturing a MOSFET according to the second embodiment.

Referring to FIGS. 24 and 25, initially, in the step (S31), electric field relaxing region 17 extending to be in contact with outer peripheral trench 22 is formed in drift layer 12. Then, in the step (S32), contact regions 14, 15 and source region 16 are formed in the region including main surface 10A. Thus, active region 10B including contact region 14 and source region 16 and potential fixing region 10C including contact region 15, where body layer 13 is exposed, are formed (see FIG. 18). Here, since outer peripheral trench 22 is formed without extending toward potential fixing region 10C in the present embodiment, potential fixing region 10C is formed without extending toward active region 10B.

Figure 26:
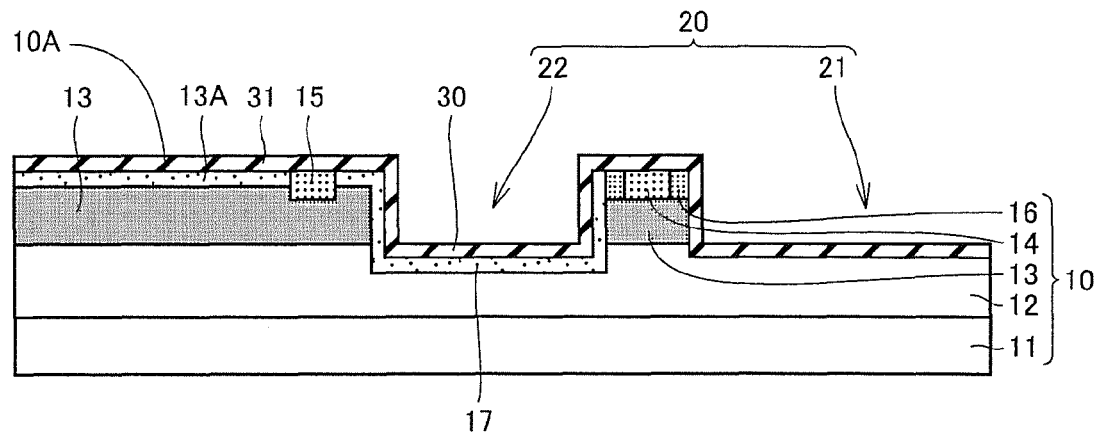
FIG. 26 is a schematic cross-sectional view for illustrating the method of manufacturing a MOSFET according to the second embodiment.
Figure 27:
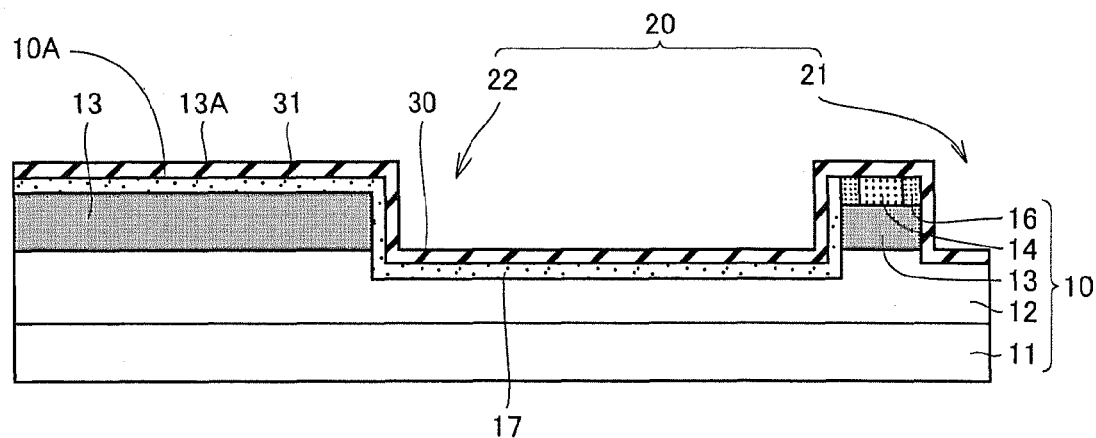
FIG. 27 is a schematic cross-sectional view for illustrating the method of manufacturing a MOSFET according to the second embodiment.

Then, the activation annealing step is performed as the step (S40). In this step (S40), as in the first embodiment, semiconductor substrate 10 is heated. Then, the oxide film formation step is performed as the step (S50). Referring to FIGS. 26 and 27, in this step (S50), as in the first embodiment, gate oxide film 30 and protection oxide film 31 are formed across the region including the wall surface of trench 20 and main surface 10A.

Figure 28:
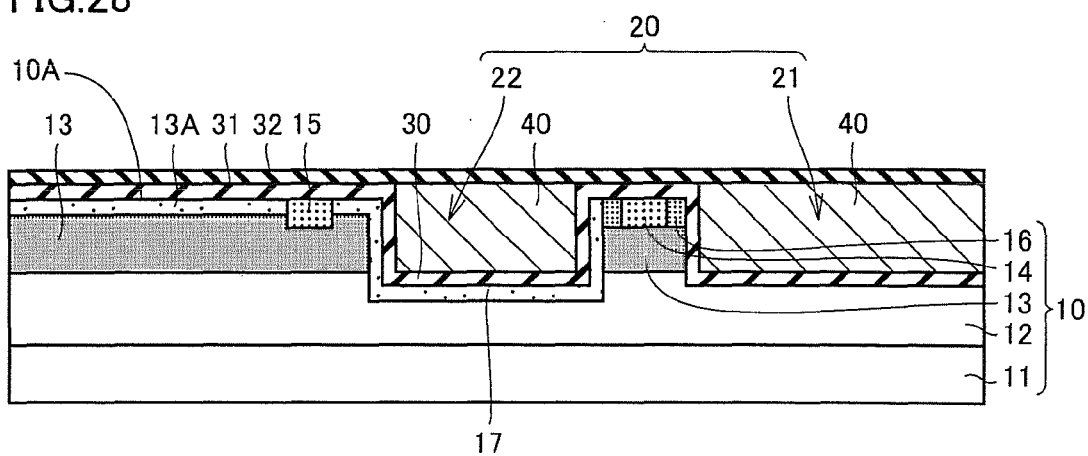
FIG. 28 is a schematic cross-sectional view for illustrating the method of manufacturing a MOSFET according to the second embodiment.
Figure 29:
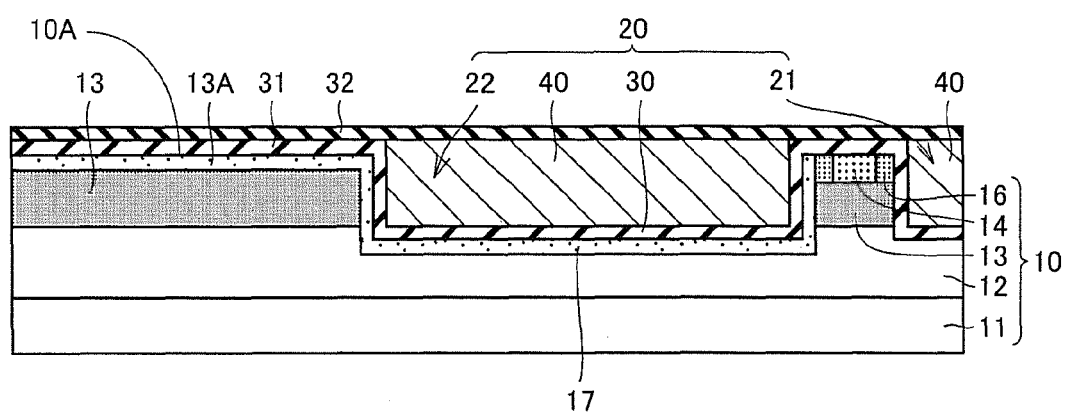
FIG. 29 is a schematic cross-sectional view for illustrating the method of manufacturing a MOSFET according to the second embodiment.

Then, the gate electrode formation step is performed as the step (S60). Referring to FIGS. 28 and 29, in this step (S60), as in the first embodiment, gate electrode 40 in contact with gate oxide film 30 is foamed. Here, in the present embodiment, since outer peripheral trench 22 is formed without extending toward potential fixing region 10C, gate electrode 40 is formed without extending toward potential fixing region 10C.

Then, the interlayer insulating film formation step is performed as the step (S70). In this step (S70), as in the first embodiment, interlayer insulating film 32 is formed to be in contact with gate electrode 40 and protection oxide film 31.

Then, the ohmic electrode formation step is performed as the step (S80). Referring to FIGS. 16 and 17, in this step (S80), as in the first embodiment, source electrode 50 and drain electrode 51 are formed.

Then, the source interconnection formation step is performed as the step (S90). In this step (S90), referring to FIGS. 16 to 19, for example, with the vapor deposition method, source interconnection 60 composed of Al which is a conductor is formed to lie over active region 10B. Then, in the present embodiment, source interconnection 60 is formed to include source interconnection extension portion 60A extending beyond outer peripheral trench 22 to potential fixing region 10C.

Then, the gate interconnection formation step is performed as the step (S100). In this step (S100), for example, with the vapor deposition method, gate interconnection 70 composed of Al which is a conductor is formed to lie over potential fixing region 10C. Then, in the present embodiment, gate interconnection 70 is formed to include gate interconnection extension portion 70A extending beyond outer peripheral trench 22 to gate electrode 40.

Then, the drain pad electrode formation step is performed as the step (S110). In this step (S110), as in the first embodiment, drain pad electrode 80 is formed to cover drain electrode 51. By performing the steps (S10) to (S110) above, MOSFET 2 is manufactured and the semiconductor device manufacturing method according to the present embodiment is completed.

As described above, in MOSFETs 1, 2 as the semiconductor devices according to the embodiments of the present invention above, active region 10B and potential fixing region 10C which is a semiconductor layer located outside active region 10B are formed. Then, potential fixing region 10C is electrically connected to source interconnection 60 arranged to lie over active region 10B. Therefore, in MOSFETs 1, 2 as the semiconductor devices according to the embodiments of the present invention above, a potential at the surface portion of the semiconductor layer located outside active region 10B can be fixed to a potential as high as a potential of source interconnection 60. Consequently, with MOSFETs 1, 2 as the semiconductor devices according to the embodiments of the present invention above, the semiconductor device excellent in breakdown voltage characteristics can be provided.

In addition, with MOSFETs 1, 2 as the semiconductor devices according to the embodiments of the present invention above, electrical connection between gate interconnection 70 arranged on potential fixing region 10C and gate electrode 40 can readily be achieved while a potential of potential fixing region 10C is fixed to a potential of source interconnection 60. Then, MOSFETs 1, 2 are different from each other in connection between potential fixing region 10C and source interconnection 60 and connection between gate interconnection 70 and gate electrode 40, as set forth below.

Initially, in MOSFET 1, source interconnection 60 is electrically connected to potential fixing region 10C without extending to potential fixing region 10C. In addition, gate interconnection 70 is electrically connected to gate electrode 40 without extending to gate electrode 40. Therefore, in MOSFET 1, source interconnection 60 and gate interconnection 70 are readily arranged while a distance therebetween is maintained when viewed two-dimensionally. Consequently, according to MOSFET 1, contact between source interconnection 60 and gate interconnection 70 can readily be avoided and short-circuiting between source interconnection 60 and gate interconnection 70 can be suppressed.

Meanwhile, in MOSFET 2, potential fixing region 10C is electrically connected to source interconnection 60 without extending to a portion below source interconnection 60. Therefore, in electrical connection between potential fixing region 10C and source interconnection 60, potential fixing region 10C can be formed more readily than in a case where potential fixing region 10C is caused to extend to the portion below source interconnection 60. In addition, gate electrode 40 is electrically connected to gate interconnection 70 without extending to a portion below gate interconnection 70. Therefore, in electrical connection between gate electrode 40 and gate interconnection 70, gate electrode 40 can be formed more readily than in a case where gate electrode 40 is caused to extend to the portion below gate interconnection 70. Consequently, according to MOSFET 2, a structure in semiconductor substrate 10 can be easier to form.

The semiconductor device and the semiconductor device manufacturing method according to the present invention can particularly advantageously be applied to a semiconductor device required to have a fixed potential at a surface portion of a semiconductor layer located outside an active region and a method of manufacturing the semiconductor device.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
   a semiconductor substrate having a trench formed in one main surface;
   a first insulating film arranged on and in contact with a wall surface of said trench;
   a gate electrode arranged on and in contact with said first insulating film; and
   a first interconnection arranged on said one main surface,
   said semiconductor substrate including
      a drift layer having a first conductivity type, and
      a body layer having a second conductivity type, which is arranged on a side of said one main surface when viewed from said drift layer,
   said trench being formed to penetrate said body layer and to reach said drift layer,
   said trench including an outer peripheral trench arranged to surround an active region when viewed two-dimensionally,
   a potential fixing region where said body layer is exposed being formed in said one main surface opposite to said active region when viewed from said outer peripheral trench,
   said first interconnection being arranged to lie over said active region when viewed two-dimensionally, and
   said potential fixing region being electrically connected to said first interconnection.

2. The semiconductor device according to claim 1, wherein
   in a region of said drift layer in contact with said outer peripheral trench, an electric field relaxing region having the second conductivity type is formed, and
   said electric field relaxing region is connected to said potential fixing region.

3. The semiconductor device according to claim 1, further comprising:
   a second insulating film arranged above said potential fixing region; and
   a second interconnection arranged above said second insulating film, wherein
   said potential fixing region includes a potential fixing region extension portion extending to a portion below said first interconnection,
   said gate electrode includes a gate electrode extension portion extending to a portion below said second interconnection,
   said potential fixing region is electrically connected to said first interconnection in said potential fixing region extension portion, and
   said gate electrode is electrically connected to said second interconnection in said gate electrode extension portion.

4. The semiconductor device according to claim 1, further comprising:
   a second insulating film arranged above said potential fixing region; and
   a second interconnection arranged above said second insulating film, wherein
   said first interconnection includes a first interconnection extension portion extending beyond said outer peripheral trench to said potential fixing region,
   said second interconnection includes a second interconnection extension portion extending beyond said outer peripheral trench to said gate electrode,
   said first interconnection is electrically connected to said potential fixing region in said first interconnection extension portion, and
   said second interconnection is electrically connected to said gate electrode in said second interconnection extension portion.

5. The semiconductor device according to claim 1, wherein an angle formed between a sidewall surface of said trench and said one main surface is from 100° to 160°.

6. The semiconductor device according to claim 1, wherein said semiconductor substrate is composed of silicon carbide.

* * * * *